(12) United States Patent
Lee (10) Patent No.: US 8,115,155 B2
(45) Date of Patent: Feb. 14, 2012

(54) 4 TRANSISTORS 4 SHARED STEP AND REPEAT UNIT CELL AND 4 TRANSISTORS 4 SHARED IMAGE SENSOR INCLUDING THE UNIT CELLS

(75) Inventor: Do-Young Lee, Seongnam-si (KR)

(73) Assignee: Siliconfile Technologies Inc., Seoul (KR)

( * ) Notice: Subject to any disclaimer, the term of this patent is extended or adjusted under 35 U.S.C. 154(b) by 364 days.

(21) Appl. No.: 12/520,089

(22) PCT Filed: Dec. 7, 2007

(86) PCT No.: PCT/KR2007/006335
§ 371 (c)(1),
(2), (4) Date: Aug. 12, 2009

(87) PCT Pub. No.: WO2008/075846
PCT Pub. Date: Jun. 26, 2008

(65) Prior Publication Data
US 2009/0309008 A1  Dec. 17, 2009

(30) Foreign Application Priority Data

Dec. 19, 2006 (KR) .................. 10-2006-0129975

(51) Int. Cl.
*H04N 3/14* (2006.01)
*H04N 5/335* (2011.01)
(52) U.S. Cl. ............... 250/208.1; 348/302; 348/294; 257/291
(58) Field of Classification Search ............ 250/208.1; 348/294, 302; 257/291
See application file for complete search history.

(56) References Cited

U.S. PATENT DOCUMENTS

| | | | | |
|---|---|---|---|---|
| 6,788,237 | B1 * | 9/2004 | Bidermann et al. | 341/155 |
| 7,078,746 | B2 | 7/2006 | Hong | |
| 7,381,584 | B2 * | 6/2008 | Lim | 438/69 |
| 7,538,374 | B2 * | 5/2009 | Kim | 257/294 |
| 7,652,699 | B2 * | 1/2010 | He et al. | 348/272 |
| 2004/0141077 | A1 | 7/2004 | Okawa | |

FOREIGN PATENT DOCUMENTS

EP  1592066 A3  8/2004

OTHER PUBLICATIONS

International Search Report of International Application No. PCT/KR2007/006335 filed on Dec. 7, 2007.
Written Opinion of the International Application No. PCT/KR2007/006335 filed on Dec. 7, 2007.

* cited by examiner

*Primary Examiner* — Seung C Sohn
(74) *Attorney, Agent, or Firm* — Kile Park Goekjian Reed & McManus PLLC

(57) ABSTRACT

A 4T-4S step & repeat unit cell obtained by combining four image sensor unit cells each including four transistors and a 4T-4S image sensor including the 4T-4S step & repeat unit cell are provided. The 4T-4S step & repeat unit cell includes first and second shared image sensor unit cells. The first shared image sensor unit cell includes first and third photodiodes and five transistors. The second shared image sensor unit cell includes second and fourth photodiodes and five transistors. The second photodiode is disposed over the first photodiode. The third photodiode is disposed at a side of the second photodiode. A terminal of each of the fourth photodiode is connected to a first voltage source. Signals corresponding to images incident onto the first and third photodiodes are output through a first common detection line OUT1. Signals corresponding to images incident onto the second and fourth photodiodes are output through a second common detection line OUT2.

16 Claims, 5 Drawing Sheets

4 TRANSISTORS 4 SHARED STEP AND REPEAT UNIT CELL AND 4 TRANSISTORS 4 SHARED IMAGE SENSOR INCLUDING THE UNIT CELLS

TECHNICAL FIELD

The present invention relates to an image sensor, and more particularly, to a 4T-4S step & repeat unit cell obtained by combining four image sensor unit cells each including four transistors.

BACKGROUND ART

Figure 1:
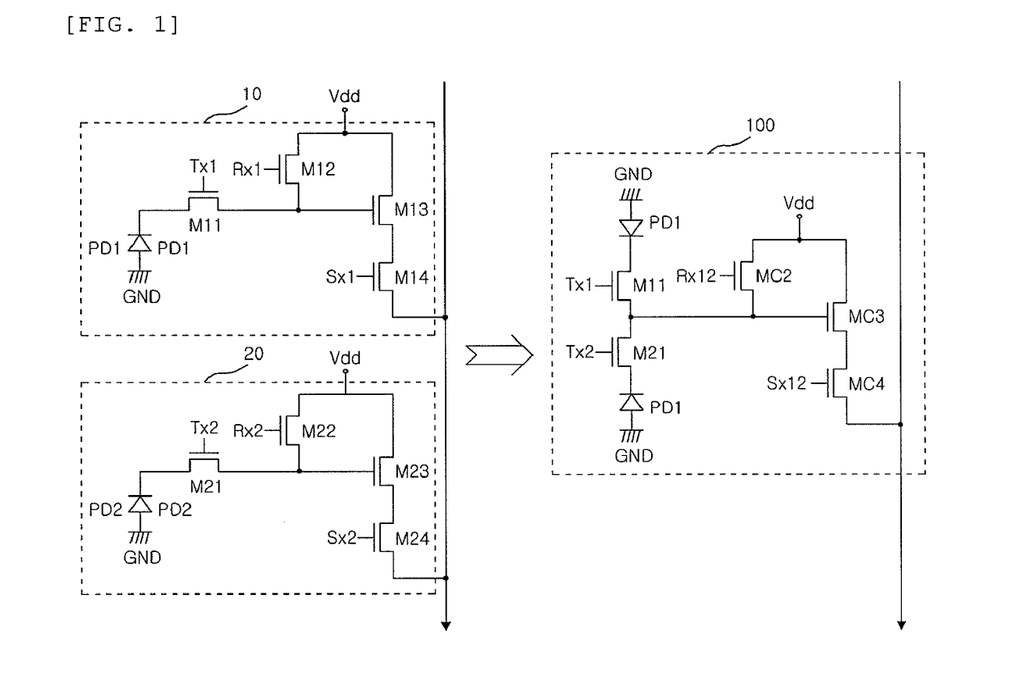
FIG. 1 illustrates a 4T-2S image sensor circuit obtained by combining two image sensor circuits each including four transistors.

FIG. 1 illustrates a 4T-2S image sensor circuit obtained by combining two image sensor circuits each including four transistors.

Referring to FIG. 1, a 4T-2S image sensor circuit 100 is obtained by combining two image sensor unit cells 10 and 20 each including four transistors. That is, reset transistors M12 and M22, conversion transistors M13 and M23, and selection transistors M14 and M24 are shared by two image sensor circuits each including four transistors. The 4T-2S image sensor circuit 100 senses and transmits electric charges corresponding to image signals generated by two photodiodes PD1 and PD2 by using three shared transistors MC2, MC3, and MC4 and two transmission transistors M11 and M21.

Here, since a reset signal Rx12 applied to a gate of a reset transistor MC2 is enabled when one of two charge transmission control signals Tx1 and Tx2 applied to gates of the transmission transistors M11 and M21 is enabled, the reset signal Rx12 is denoted by using '12'. Similarly, a selection signal Sx12 applied to a gate of a selection transistor MC4 is denoted by using '12'.

As described above, a single 4T-2S image sensor circuit obtained by combining two image sensor circuits each including four transistors may be laid out in various manners. A conventional combined cell obtained by combining four cells has a structure in which a floating node is shared through four photodiodes and four transmission transistors connected to the four photodiodes. Accordingly, when a problem occurs in a cell among the four cells, the other cells cannot be used. This largely influences yields of products.

DETAILED DESCRIPTION OF THE INVENTION

Technical Goal of the Invention

The present invention provides a 4T-4S step & repeat unit cell obtained by combining four image sensor unit cells each including four transistors.

The present invention also provides a 4T-4S image sensor including a plurality of 4T-4S step & repeat unit cells obtained by combining four image sensor unit cells each including four transistors.

Disclosure of the Invention

According to an aspect of the present invention, there is provided a 4T-4S step & repeat unit cell including first and second shared image sensor unit cells.

The first shared image sensor unit cell includes first and third photodiodes and five MOS transistors. The second shared image sensor unit cell includes second and fourth photodiodes and five MOS transistors. The second photodiode is disposed over the first photodiode. The third photodiode is disposed at a side of the second photodiode. The fourth photodiode is disposed over the third photodiode. A terminal of each of the first to fourth photodiodes is connected to a first voltage source. Signals corresponding to images incident onto the first and third photodiodes are output through a first common detection line OUT1. Signals corresponding to images incident onto the second and fourth photodiodes are output through a second common detection line OUT2.

According to another aspect of the present invention, there is provided a 4T-4S image sensor in which a plurality of the 4T-4S step & repeat unit cells are two-dimensionally arranged, wherein a plurality of common detection lines are vertically or horizontally arranged between neighboring 4T-4S step & repeat unit cells among the two-dimensionally arranged plurality of 4T-4S step & repeat unit cells, and wherein the plurality of 4T-4S step & repeat unit cells arranged along the plurality of common detection lines output conversion voltages corresponding to image signals incident onto photodiodes through two neighboring common detection lines.

BRIEF DESCRIPTION OF THE DRAWINGS

The above and other features and advantages of the present invention will become more apparent by describing in detail exemplary embodiments thereof with reference to the attached drawings in which.

BEST MODE FOR CARRYING OUT THE INVENTION

Hereinafter, the present invention will be described in detail with reference to accompanying drawings.

When a given circuit is laid out, predetermined unit cells may be repeated arranged. In this case, the unit cells are arranged in a step & repeat manner. This indicates that the unit cells are successively arranged in horizontal and vertical directions. The term of a step & repeat manner to be used later includes the aforementioned description. Step & repeat unit cells indicate unit cells that are repeatedly arranged.

Figure 2:
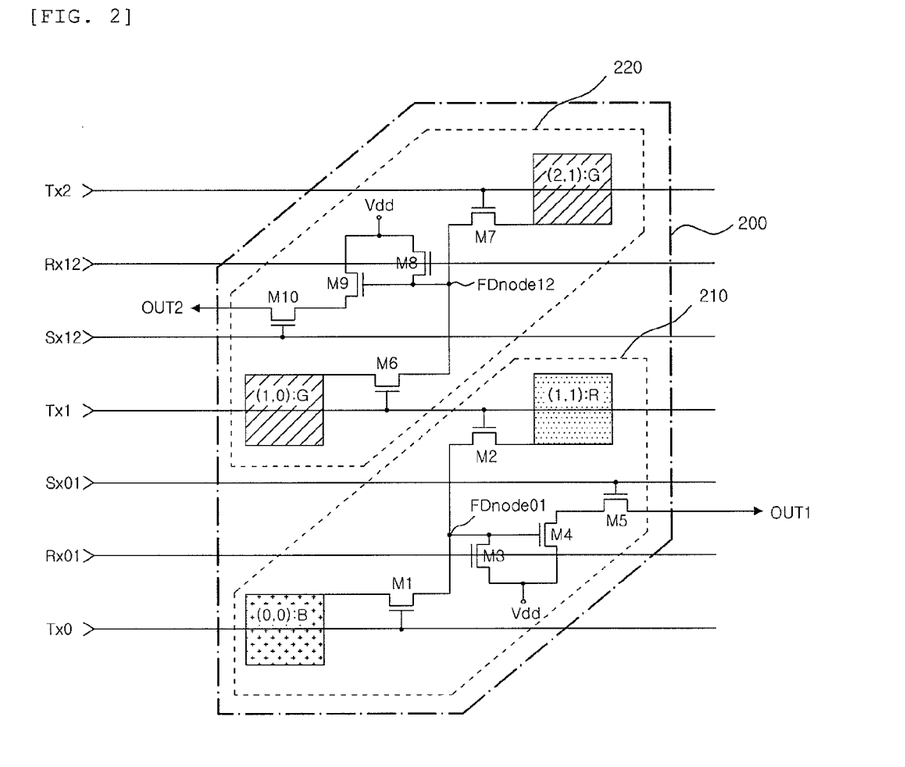
FIG. 2 illustrates 4T-4S step & repeat unit cell according to an embodiment of the present invention.

FIG. 2 illustrates 4T-4S step & repeat unit cell according to an embodiment of the present invention.

Referring to FIG. 2, a 4T-4S step & repeat unit cell 200 includes first and second shared image sensor unit cells 210 and 220.

The 4T-4S step & repeat unit cell 200 includes a first photodiode (0, 0), a second photodiode (1, 0) disposed over the first photodiode (0, 0), a third photodiode (1, 1) disposed at the left side of the second photodiode (1, 0), and a fourth photodiode (2, 1) disposed over the third photodiode (1, 1).

Although not shown, a terminal of each of the four photodiodes (0, 0) to (2, 1) is connected to a first voltage source, that is, a ground voltage (GND).

The first shared image sensor unit cell 210 includes two photodiodes (0, 0) and (1, 1) and five MOS transistors M1 to M5.

A first transmission transistor M1 has a terminal connected to the other terminal of the first photodiode (0, 0) and a gate applied with a first transmission signal Tx0. A second transmission transistor M2 has a terminal connected to the other terminal of the third photodiode (1, 1) and a gate applied with a second transmission signal Tx1. A first reset transistor M3 has a terminal commonly connected to the other terminal of the first transmission transistor M1 and the other terminal of the second transmission transistor M2, the other terminal connected to a second voltage source Vdd, and a gate applied with a 01-reset signal Rx01. A first conversion transistor M4 has a terminal connected to the second voltage source Vdd and a gate commonly connected to the other terminal of the first transmission transistor M1 and the other terminal of the second transmission transistor M2. A first selection transistor M5 has a terminal connected to the other terminal of the first conversion transistor M4, a gate applied with a 01-selection signal Sx01, and the other terminal connected to a first common detection line OUT1.

The second shared image sensor unit cell 220 includes two photodiodes (1, 0) and (2, 1) and five MOS transistors M6 to M10.

A third transmission transistor M6 has a terminal connected to the other terminal of the second photodiode (1, 0) and a gate applied with a second transmission signal Tx1. A fourth transmission transistor M7 has a terminal connected to the other terminal of the fourth photodiode (2, 1) and a gate applied with a third transmission signal Tx2. A second reset transistor M8 has a terminal commonly connected to the other terminal of the third transmission transistor M6 and the other terminal of the fourth transmission transistor M7, the other terminal connected to the second voltage source Vdd, and a gate applied with a 12-reset signal Rx12. A second conversion transistor M9 has a terminal connected to the second voltage source Vdd and a gate commonly connected to the other terminal of the third transmission transistor M6 and the other terminal of the fourth transmission transistor M7. A second selection transistor M10 has a terminal connected to the other terminal of the second conversion transistor M9, a gate applied with a 12-selection signal Sx12, and the other terminal connected to a second common detection line OUT2.

Although the first and second common detection lines OUT1 and OUT 2 transmit signals respectively in right and left directions of the unit cell 200 in FIG. 2, this is used for the convenience of description. In practice, the first and second common detection lines OUT1 and OUT2 may transmit signals in the opposite directions. In addition, the first and second common detection lines may transmit signals in the right or left direction of the unit cell 200. These connections will be described with reference to an image sensor to be described later.

Referring to FIG. 2, in the 4T-4S step & repeat unit cell according to the embodiment, since each two of the four transmission transistors M1, M2, M6, and M7 are respectively connected to two common nodes FDnode01 and FDnode12, even when a problem occurs in one of the four cells, two cells of the other three cells normally operates. Accordingly, it is possible to improve yields of products.

Figure 3:
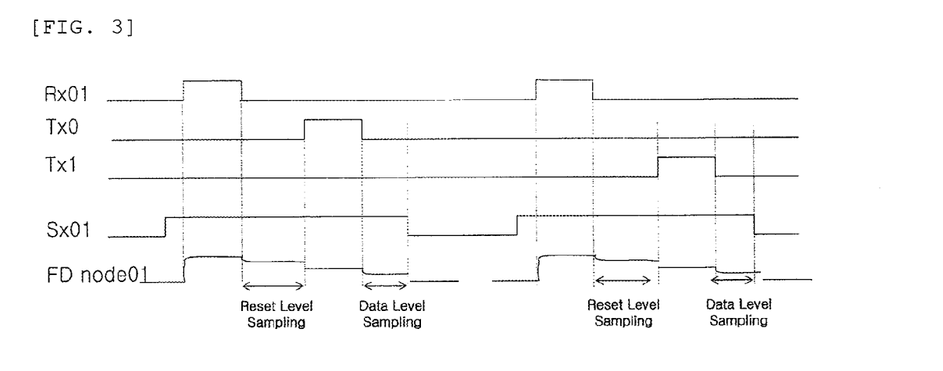
FIG. 3 is a timing diagram illustrating signals used for a first shared image sensor unit cell 210 shown in FIG. 2.

FIG. 3 is a timing diagram illustrating signals used for a first shared image sensor unit cell 210 shown in FIG. 2.

Referring to FIG. 3, in order to output conversion voltages corresponding to image signals detected from the first and third photodiodes (0, 0) and (1, 1) through the first common detection line OUT1, the following processes are performed.

1) First, the 01-selection signal Sx01 is enabled at a high level.

2) After the 01-selection signal Sx01 is at the high level, a voltage of the second voltage source Vdd applied via the first reset transistor M3 in response to the 01-reset signal Rx01 resets the common connection part FDnode01 of the first and second transmission transistors M1 and M2.

3) Electric charges generated in correspondence with the image signal incident onto the first photodiode (0, 0) while performing procedures 1) and 2) are accumulated at the common terminal of the first photodiode (0, 0) and the first transmission transistor M1. The accumulated electric changes are transmitted to the common connection part FDnode01 via the first transmission transistor M1 for a time period for which the first transmission signal Tx0 is enabled at the high level after a predetermined time (exposure time). Since the common connection part FDnode01 is reset by the highest voltage of the system, the voltage level at the common connection part FDnode01 decreases to a predetermined voltage level in correspondence with the transmitted electric charges. The first conversion transistor M4 generates a conversion voltage corresponding to the voltage level at the common connection part FDnode01. Since the first selection transistor M5 is turned on in response to the 01-selection signal Sx01, a conversion voltage corresponding to the image signal detected from the first photodiode (0, 0) is output.

4) After the conversion voltage corresponding to the image signal detected from the first photodiode (0, 0) is sampled, the 01-selection signal Sx01 is disabled at a low level. A procedure of outputting the conversion voltage corresponding to the image signal detected from the third photodiode (1, 1) through the first common detection line OUT1 starts after a predetermined time. First, the 01-selection signal Sx01 is enabled at the high level, again.

5) After the 01-selection signal Sx01 is at the high level, the voltage of the second voltage source Vdd applied via the first reset transistor M3 in response to the 01-reset signal Rx01 resets the common connection part FDnode01 of the first and second transmission transistors M1 and M2.

6) Electric charges generated in correspondence with the image signal incident onto the third photodiode (1, 1) while performing procedures 4) and 5) are accumulated at the common terminal of the third photodiode (1, 1) and the second transmission transistor M2. The accumulated electric changes are transmitted to the common connection part FDnode01 via the second transmission transistor M2 for a time period for which the second transmission signal Tx1 is enabled at the high level after a predetermined time (exposure time). Since the common connection part FDnode01 is reset by the highest voltage of the system, the voltage level of the common connection part FDnode01 decreases to a predetermined voltage level in correspondence with the transmitted electric charges. The first conversion transistor M4 generates a conversion voltage corresponding to the voltage level of the common connection part FDnode01. Since the first selection transistor M5 is turned on in response to the 01-selection signal Sx01, a conversion voltage corresponding to the image signal detected from the third photodiode PD3 is output.

Although only waveforms of signals used for the first shared image sensor unit cell 210 are shown, it is possible to describe the operation of the second shared image sensor unit cell 220 based on the aforementioned description.

That is, if in a part in which the operation of the first shared image sensor unit cell 210 is described, the second and fourth photodiodes (1, 0) and (2, 1) respectively replace the first and third photodiodes (0, 0) and (1, 1), the second and third transmission signals Tx1 and Tx2 respectively replace the first and second transmission signals Tx0 and Tx1, and the 12-reset signal Rx12 and the 12-selection signal Sx12 respectively replace the 01-reset signal Rx01 and the 01-selection signal Sx01, the operation of the first shared image sensor unit cell 210 is replaced by the operation of the second shared image sensor unit 220. Similarly, the common connection part FDnode01 of the first and second transmission transistors M1 and M2 will be replaced by the common connection part FDnode12 of the third and fourth transmission transistors M6 and M7.

In addition, although only a single unit cell 200 is described, since the 01-reset signal Rx01 and the 01-selection signal Sx01 respectively cover zeroth and first lines and since the 12-reset signal Rx12 and the 12-selection signal Sx12 respectively cover first and second lines, it is possible to analogize an image sensor that operates in line units to the single unit cell 200.

Figure 4:
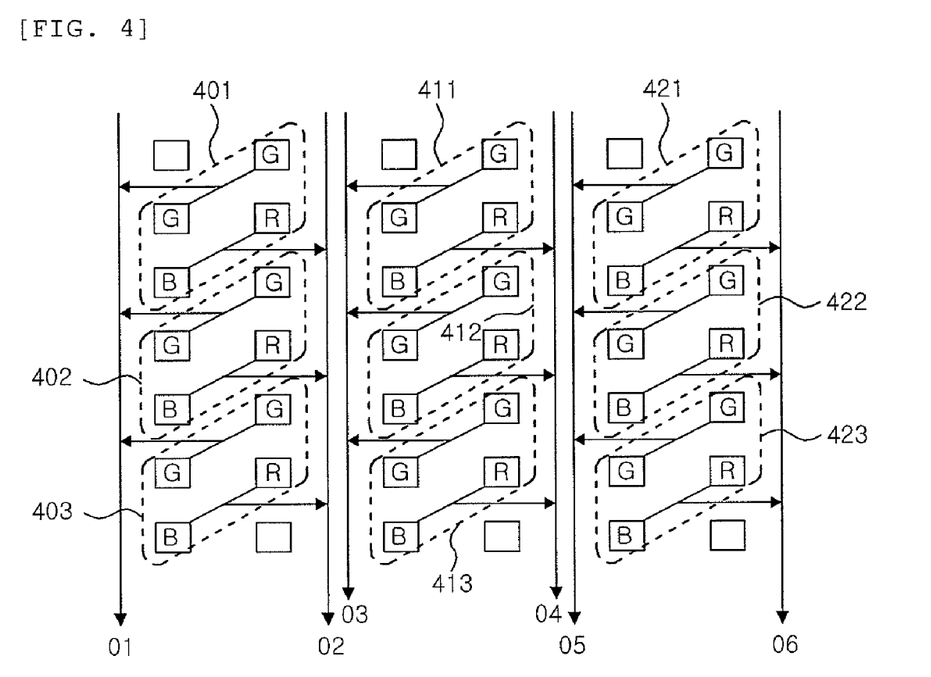
FIG. 4 is a schematic diagram illustrating an image sensor according to an embodiment of the present invention.

FIG. 4 is a schematic diagram illustrating an image sensor according to an embodiment of the present invention.

Referring to FIG. 4, conversion voltages output from the 4T-4S step & repeat unit cells according to the embodiment shown in FIG. 2 are output through common detection lines O1 to O6 arranged on both sides of the unit cells.

A plurality of unit cells 401 to 403 are arranged between first and second common detection lines O1 and O2. Two photodiodes G among four photodiodes included in each unit cell detects an image signal incident through a green filter. A conversion voltage corresponding to the detected image signal is output through the first common detection line O1. The other two photodiodes B and R detects an image signal through blue and red filters. A conversion voltage corresponding to the detected image signal is output through the second common detection line O2.

Accordingly, only conversion voltages for image signals incident through green filters in the three unit cells 401 to 403 are output through the first common detection line O1. Only conversion voltages for image signals incident through blue and red filters in the three unit cells 401 to 403 are output through the second common detection line O2.

Similarly, only conversion voltages for image signals incident through green filters in three unit cells 411 to 413 are output through a third common detection line O3. Only conversion voltages for image signals incident through blue and red filters in the three unit cells 411 to 413 are output through a fourth common detection line O4. Fifth and sixth common detection lines O5 and O6 similarly operate.

Finally, the common detection line through which the conversion voltages for the image signals incident through the green filters are output and the common detection line through which the conversion voltages for the image signals incident through the blue and red filters are output are alternately arranged.

Figure 5:
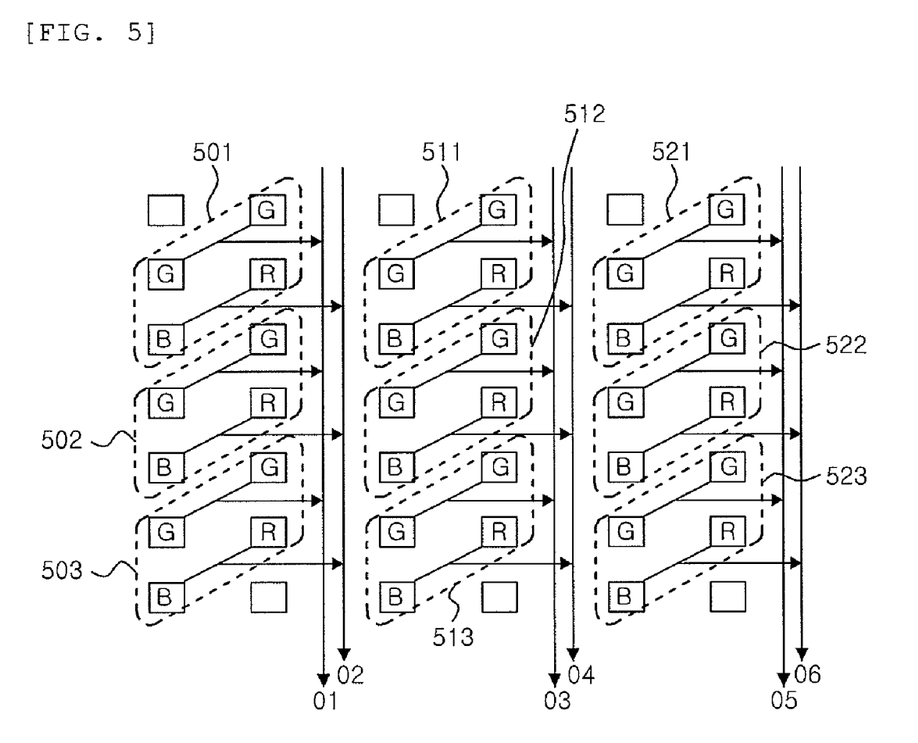
FIG. 5 is a schematic diagram illustrating an image sensor according to another embodiment of the present invention.

FIG. 5 is a schematic diagram illustrating an image sensor according to another embodiment of the present invention.

Referring to FIG. 5, conversion voltages output from the 4T-4S step & repeat unit cells according to the embodiment shown in FIG. 2 are output through two common detection lines arranged at a side of each unit cell. That is, three unit cells 501 to 503 output conversion voltages through two common detection lines O1 and O2 arranged in the right side of the three unit cells 501 to 503. Similarly, another three unit cells 511 to 513 output conversion voltages through two common detection lines O3 and O4 in the right side of the three unit cells 511 to 513. Still another three unit cells 521 to 523 output conversion voltages through two common detection lines O5 and O6 in the right side of the three unit cells 521 to 523.

Although in the drawings, conversion voltages are output through two common detection lines arranged in the right side of unit cells, the conversion voltages may be output through two common detection lines arranged in the left side of the unit cells.

However, although the conversion voltages are output through the common detection lines arranged in any side of the unit cells, the common detection line through which the conversion voltages for the image signals incident through the green filters are output and the common detection line through which the conversion voltages for the image signals incident through the blue and red filters are output are alternately arranged.

As described in FIGS. 4 and 5, one of core ideas of the present invention indicates that common detection lines dedicated to output conversion voltages for image signals incident through green filters are distinguished from common detection lines dedicated to output conversion voltages for image signals incident through blue and red filters. The aforementioned distinguishment is considerably advantageous so as to process signals that are output through the two dedicated common detection lines.

In general, conversion voltages corresponding to image signals incident through the green filters and conversion voltages corresponding image signals incident through the blue and red filters are separately processed. In a conventional case, since all the conversion voltages for image signals incident through three types of filters are output through a single common detection line, a unit for classifying the conversion voltages is required. The unit occupies an area on a layout. A time and power consumption are required so as to allow the unit to classify the conversion voltages. According to recent technical trends for reducing an area of the entire system by reducing an area of peripheral circuits, the aforementioned unit decreases competitive power of the system.

The 4T-4S image sensor including 4T-4S step & repeat unit cells according to an embodiment of the present invention does not require the additional unit for classifying conversion voltages for image signals incident through three types of filters.

Figure 6:
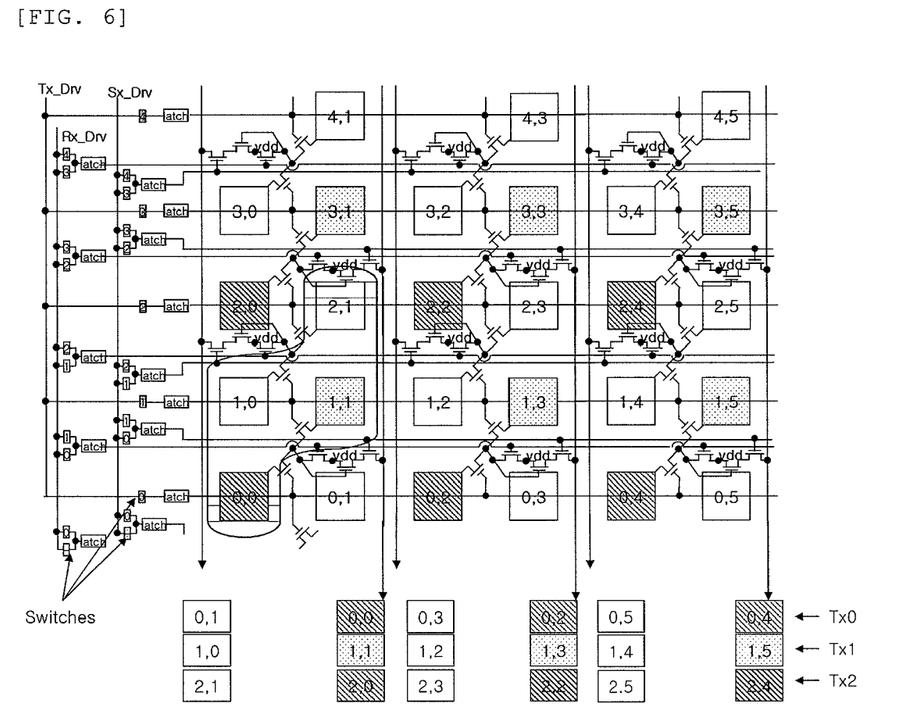
FIG. 6 is a practical circuit diagram illustrating the image sensor according to the embodiment of the present invention shown in FIG. 4.

FIG. 6 is a practical circuit diagram illustrating the image sensor according to the embodiment of the present invention shown in FIG. 4.

Referring to FIG. 6, conversion voltages for image signals incident via green filters are output through odd-numbered common detection lines from the leftmost side of the image sensor. Conversion voltages for image signals incident via blue and red filters are output through even-numbered common detection lines.

For the convenience of understanding, second and third transmission signals Tx1 and Tx2 will be described based on that the image sensor operates in response to a first transmission signal Tx0 with respect to a zeroth line. Here, transmission signals Tx, reset signals Rx, and selection signals Sx are output from a transmission signal driving device Tx_Drv, a reset signal driving device Rx_Drv, and a selection signal driving device Sx_Drv, respectively.

Conversion voltages for image signals incident onto six photodiodes (1, 0) to (1, 5) arranged in a first line are output through six common detection lines O1 to O6 in response to the second transmission signal Tx1, a 01-reset signal Rx01, and a 01-selection signal Sx01, respectively. That is, conversion voltages for image signals incident onto three photodiodes (1, 0), (1, 2), and (1, 4) via green filters are output through odd-numbered common detection lines O1, O3, and O5, respectively. Conversion voltages for image signals incident onto three photodiodes (1, 1), (1, 3), and (1, 5) via red filters are output through even-numbered common detection lines O2, O4, and O6.

Conversion voltages for image signals incident onto six photodiodes (2, 0) to (2, 5) arranged in a second line are output through six common detection lines O1 to O6 in response to the third transmission signal Tx2, a 12-reset signal Rx12, and a 12-selection signal Sx12, respectively. That is, conversion voltages for image signals incident onto three photodiodes (2, 0), (2, 2), and (2, 4) via blue filters are output through the even-numbered common detection lines O2, O4, and O6, respectively. Conversion voltages for image signals incident onto three photodiodes (2, 1), (2, 3), and (2, 5) via green filters are output through the odd-numbered common detection lines O1, O3, and O5, respectively.

When the aforementioned description is applied to the other lines, the conclusion is as follows. Conversion voltages for image signals incident via green filters are output through odd-numbered common detection lines. Conversion voltages for image signals incident via blue and red filters are output through even-numbered common detection lines.

Although in FIG. 6, the conversion voltages for the image signals incident via the green filters are output through the odd-numbered common detection lines, and the conversion voltages for the image signals incident via the blue and red filters are output through the even-numbered common detection lines, it is possible to oppositely connect the common detection lines.

Latches and switches represented by rectangles shown in FIG. 6 are components of the image sensor. Since the operations of the latches and the switches are well known, description on the latches and the switches will be omitted.

In general, the 4T-4S step & repeat unit cell according to an embodiment of the present invention may be embodied as a semiconductor chip. Accordingly, a layout pattern corresponding to the 4T-4S step & repeat unit cell according to an embodiment of the present invention is firstly generated and stored in a data storage device such as a pattern generation tape (PG tape). A semiconductor processing mask is generated by using information on the layout pattern stored in the data storage device. The mask is used for a process of manufacturing a semiconductor using a semiconductor wafer.

While the present invention has been particularly shown and described with reference to exemplary embodiments thereof, it will be understood by those skilled in the art that various changes in form and details may be made therein without departing from the spirit and scope of the present invention as defined by the appended claims.

INDUSTRIAL APPLICABILITY

As described above, in regard to the 4T-4S step & repeat unit cell and the image sensor including the 4T-4S step & repeat unit cell, it is possible to conveniently lay out a two-dimensional image sensor by using the 4T-4S step & repeat unit cell by combining four image sensor unit cells each including four transistors into a single 4T-4S step & repeat unit cell and to simply and rapidly process signals by distinguishing common detection lines dedicated to output image signals incident via green filters from common detection lines dedicated to output image signals incident via blue and red filters. In addition, even when a problem occurs in one of four image sensor unit cells constituting a single 4T-4S step & repeat unit cell, it is possible to use two image sensor unit cells among the other three image sensor unit cells.

The invention claimed is:

1. A 4T-4S step & repeat unit cell comprising:
   a first photodiode;
   a second photodiode disposed over the first photodiode;
   a third photodiode disposed at a side of the second photodiode; and
   a fourth photodiode disposed over the third photodiode,
   wherein a first shared image sensor unit cell is constructed by combining the first and third photodiodes with five transistors, and a second shared image sensor unit cell is constructed by combining the second and fourth photodiodes with five transistors, and
   wherein signals corresponding to images incident onto the first and third photodiodes are output through a first common detection line OUT1, signals corresponding to images incident onto the second and fourth photodiodes are output through a second common detection line OUT2, and a terminal of each of the four photodiodes is connected to a first voltage source.

2. The 4T-4S step & repeat unit cell of claim 1, wherein the first shared image sensor unit cell includes:
   a first transmission transistor M1 including a terminal connected to the other terminal of the first photodiode and a gate applied with a first transmission signal Tx0;
   a second transmission transistor M2 including a terminal connected to the other terminal of the third photodiode and a gate applied with a second transmission signal Tx1;
   a first reset transistor M3 including a terminal commonly connected to the other terminal of the first transmission transistor and the other terminal of the second transmission transistor, the other terminal connected to a second voltage source Vdd, and a gate applied with a 01-reset signal Rx01;
   a first conversion transistor M4 including a terminal connected to the second voltage source and a gate commonly connected to the other terminal of the first transmission transistor and the other terminal of the second transmission transistor; and
   a first selection transistor M5 including a terminal connected to the other terminal of the first conversion transistor, a gate applied with a 01-selection signal Sx01, and the other terminal connected to the first common detection line OUT1.

3. The 4T-4S step & repeat unit cell of claim 2, wherein the second shared image sensor unit cell includes:
   a third transmission transistor M6 including a terminal connected to the other terminal of the second photodiode and a gate applied with a second transmission signal Tx1;
   a fourth transmission transistor M7 including a terminal connected to the other terminal of the fourth photodiode and a gate applied with a third transmission signal Tx2;
   a second reset transistor M8 including a terminal commonly connected to the other terminal of the third transmission transistor M6 and the other terminal of the fourth transmission transistor M7 and the other terminal connected to a second voltage source;
   a second conversion transistor M9 including a terminal connected to the second voltage source and a gate commonly connected to the other terminal of the third transmission transistor M6 and the other terminal of the fourth transmission transistor M7; and
   a second selection transistor M10 including a terminal connected to the other terminal of the second conversion transistor M9, a gate applied with a 12-selection signal Sx12, and the other terminal connected to the second common detection line OUT2.

4. The 4T-4S step & repeat unit cell of claim 3, wherein the first and second voltage sources are respectively low-level and high-level voltage sources among voltage sources used for a system to which the step & repeat unit cells are applied.

5. The 4T-4S step & repeat unit cell of claim 1,
wherein when the first and third photodiodes PD1 and PD3 operate in response to image signals incident via a first filter, the second and fourth photodiodes PD2 and PD4 operate in response to image signals incident respectively via second and third filters, and
wherein when the second and fourth photodiodes PD2 and PD4 operate in response to the image signals incident via the first filter, the first and third photodiodes PD1 and PD3 operate in response to image signals incident respectively via the second and third filters.

6. The 4T-4S step & repeat unit cell of claim 5, wherein the first filter is a green filter, the second and third filters are red and blue filters.

7. The 4T-4S step & repeat unit cell of claim 3,
wherein the 01-reset signal Rx01 is enabled respectively in relation to the first and second transmission signals Tx0 and Tx1,
wherein the 12-reset signal Rx12 is enabled respectively in relation to the second and third transmission signals Tx1 and Tx2,
wherein the 01-selection signal Sx01 is enabled respectively in relation to the first and second transmission signals Tx0 and Tx1, and
wherein the 12-selection signal Rx12 is enabled respectively in relation to the second and third transmission signals Tx1 and Tx2.

8. A 4T-4S image sensor in which a plurality of the 4T-4S step & repeat unit cells of claim 1 are two-dimensionally arranged,
wherein a plurality of common detection lines are vertically or horizontally arranged between neighboring 4T-4S step & repeat unit cells among the two-dimensionally arranged plurality of 4T-4S step & repeat unit cells, and
wherein the plurality of 4T-4S step & repeat unit cells arranged along the plurality of common detection lines output conversion voltages corresponding to image signals incident onto photodiodes through two neighboring common detection lines.

9. The 4T-4S image sensor of claim 8, wherein each of the 4T-4S step & repeat unit cells outputs conversion voltages corresponding to image signals incident onto two photodiodes via green filters through a single common detection line and outputs conversion voltages corresponding to images signals incident onto another two photodiodes via red and blue filters through another single common detection line.

10. The 4T-4S image sensor of claim 9,
wherein two common detection lines are arranged on the outermost sides of the two-dimensionally arranged plurality of 4T-4S step & repeat unit cells, two common detection lines are arranged between neighboring 4T-4S step & repeat unit cells among the plurality of 4T-4S step & repeat unit cells, and
wherein in regard to two common detection lines arranged on both sides of each 4T-4S step & repeat unit cell, conversion voltages corresponding to image signals incident via green filters are output through a common detection line arranged on a side of each 4T-4S step & repeat unit cell, and conversion voltages corresponding to image signals incident via red and blue filters are output through the other common detection line arranged on the other side of each 4T-4S step & repeat unit cell.

11. The 4T-4S image sensor of claim 10, wherein in regard to the plurality of common detection lines, common detection lines through which conversion voltages generated in correspondence with image signals incident via green filters are output and common detection lines through which conversion voltages generated in correspondence with image signals incident via red and blue filters are output are alternately arranged.

12. The 4T-4S image sensor of claim 9,
wherein no common detection line is arranged in an outermost side of the two-dimensionally arranged plurality of 4T-4S step & repeat unit cells and two common detection lines are arranged in the other outermost side of the two-dimensionally arranged plurality of 4T-4S step & repeat unit cells and between neighboring 4T-4S step & repeat unit cells, and
wherein conversion voltages generated in correspondence with image signals incident via green filters are output through a common detection line of the two common detection lines arranged in an outermost side of the 4T-4S step & repeat unit cells, and conversion voltages generated in correspondence with image signals incident via red and blue filters are output through the other common detection line.

13. The 4T-4S image sensor of claim 12, wherein in regard to the plurality of common detection lines, common detection lines through which conversion voltages generated in correspondence with image signals incident via green filters are output and common detection lines through which conversion voltages generated in correspondence with image signals incident via red and blue filters are output are alternately arranged.

14. A data storage device including information on layout patterns obtained by embodying the 4T-4S step & repeat unit cell of claim 1.

15. A mask for a semiconductor process formed by using information on layout patterns stored in the data storage device of claim 14.

16. A semiconductor wafer embodied by using the mask for the semiconductor process of claim 15.

* * * * *